United States Patent [19]

Benton et al.

[11] Patent Number: 5,107,538
[45] Date of Patent: Apr. 21, 1992

[54] OPTICAL WAVEGUIDE SYSTEM COMPRISING A RARE-EARTH SI-BASED OPTICAL DEVICE

[75] Inventors: Janet L. Benton, Warren; Dale C. Jacobson, Hackettstown, both of N.J.; Lionel C. Kimerling; Jurgen Michel, both of Cambridge, Mass.; John M. Poate, Summit, N.J.

[73] Assignee: AT&T Bell Laboratories, Murray Hill, N.J.

[21] Appl. No.: 711,243

[22] Filed: Jun. 6, 1991

[51] Int. Cl.$^5$ .............................. G02B 6/10; H01S 3/30
[52] U.S. Cl. .................................. 385/130; 385/14; 385/132; 385/142; 372/7; 372/43; 372/68
[58] Field of Search ............... 350/96.11, 96.12, 96.13, 350/96.14, 96.15, 96.34; 372/6, 7, 21, 43, 50, 68

[56] References Cited

U.S. PATENT DOCUMENTS

| | | | |
|---|---|---|---|
| 4,575,919 | 3/1986 | Logan et al. | 372/7 |
| 4,737,015 | 4/1988 | Ishida et al. | 350/96.34 |
| 4,923,279 | 5/1990 | Ainslie et al. | 350/96.30 |
| 4,962,995 | 10/1990 | Andrews et al. | 350/96.34 |
| 4,993,034 | 2/1991 | Aoki et al. | 372/7 |
| 5,005,175 | 4/1991 | Desurvire et al. | 372/6 |
| 5,007,698 | 4/1991 | Sasaki et al. | 350/96.15 |
| 5,023,885 | 6/1991 | Auracher et al. | 372/6 |
| 5,027,079 | 6/1991 | Desurvire et al. | 372/6 X |
| 5,039,190 | 8/1991 | Blonder et al. | 359/341 |

OTHER PUBLICATIONS

"1.54-μm Luminescence of Erbium-Implanted III-V Semiconductors and Silicon", by H. Ennen et al., *Applied Physics Letters*, 43(10), Nov. 15, 1983, pp. 943–945.

"1.54-μm Electroluminescence of Erbium-Doped Silicon Grown by Molecular Beam Epitaxy", by H. Ennen et al., *Applied Physics Letters*, 46(4), Feb. 15, 1985, pp. 381–383.

"Optical Activation of $Er^{3+}$ Implanted in Silicon by Oxygen Impurities", by P. N. Favennec et al., *Japanese Journal of Applied Physics*, vol. 29, No. 4, Apr., 1990, pp. L524–L526.

"Waveguided Electro-Optical Intensity Modulation in a $Si/Ge_xSi_{1-x}/Si$ Heterojunction Bipolar Transistor", by R. D. Lareau et al., *Electronics Letters*, vol. 26, No. 20, Sep. 27, 1990, pp. 1653–1655.

*Primary Examiner*—Brian Healy
*Attorney, Agent, or Firm*—Eugen E. Pacher

[57] ABSTRACT

It has been discovered that co-doping of Er-doped Si with a light element such as C, N or F can result in substantially increased Er luminescence. A further increase in luminescence can result if, in addition, oxygen is present in the Si. Apparatus or systems according to the invention comprise a device (e.g., laser, optical amplifier, LED) that comprises a planar waveguide whose core region contains, in addition to at least 90 atomic % Si or SiGe alloy, Er, Pr and/or Nd, and further contains C, N and/or F, and preferably also contains oxygen. Currently preferred apparatus or systems according to the invention comprise means for electrically pumping the waveguide means.

10 Claims, 2 Drawing Sheets

OPTICAL WAVEGUIDE SYSTEM COMPRISING A RARE-EARTH SI-BASED OPTICAL DEVICE

FIELD OF THE INVENTION

This invention pertains to the field of optical devices, including optoelectronic devices that utilize spontaneous or stimulated emission of radiation.

BACKGROUND OF THE INVENTION

It has long been recognized that it would be highly desirable to have available Si-based lasers, LEDs or optical amplifiers, since availability of these devices would greatly ease the difficulty of integrating optical and electronic functions on a single chip. Furthermore, the high thermal conductivity of Si could result in operational advantages. However, up to now efforts to obtain Si-based LEDs, lasers or amplifiers, especially such devices that operate at commercially interesting wavelengths (e.g., about 1.3 or 1.5 $\mu$m) have not been successful.

H. Ennen et al. [*Applied Physics Letters*, Vol. 43, page 943 (1983)] pointed out the potential of rare earth (RE) ions in a semiconductor matrix for the development of LED's and lasers. Erbium (Er) is a promising candidate because it shows luminescence in Si at about 1.54 $\mu$m, a wavelength of interest for, inter alia, optical fiber communications. See, for instance, H. Ennen et al., *Applied Physics Letters*, Vol. 46, page 381 (1985). Recently it was observed that the presence of oxygen in Er-doped Si results in increased Er photoluminescence, [P. M. Favennec et al., *Japanese Journal of Applied Physics*, Vol. 29, page L524, (1990)]. In these studies Er was introduced into Si by implantation, either during MBE growth or in the as-grown substrate. Further background material can be found in U.S. patent application Ser. No. 07/579,118, filed Sept. 7, 1990 for G. E. Blonder et al., now U.S. Pat. No. 5,039,190, incorporated herein by reference.

However, despite intense effort and some resultant progress, the art has not yet succeeded in the quest for a Si-based RE-doped LED, laser or optical amplifier, at least in part due to the fact that the observed luminescence is too weak to support such a device. Thus, it would be of substantial interest to discover means for increasing the luminescence from RE-doped Si beyond what can be obtained by the incorporation of oxygen into the Si. This application discloses such means.

SUMMARY OF THE INVENTION

In a broad aspect the invention is an article or a system that comprises an optical device, typically a device that utilizes stimulated emission (i.e., a laser or amplifier), but not excluding a light emitting diode (LED). The device according to the invention comprises rare earth (preferably Er, Pr and/or Nd)-doped Si-based planar means adapted for guiding or confining electromagnetic radiation of a predetermined wavelength. Such planar means will herein collectively be referred to as planar waveguide means. The waveguide material exhibits increased luminescence, as compared to the analogous prior art RE-doped Si, including prior art RE-doped Czochralski-grown (CZ) Si.

More specifically, the waveguide means are adapted for guiding signal radiation of wavelength $\lambda_s$. The gain device also comprises means for causing at least some of the RE in the waveguide means to undergo an electronic transition to an excited electronic state that is associated with luminescence. Exemplarily, said causing means comprise means for coupling pump radiation of wavelength $\lambda_p < \lambda_s$ into the waveguide means. However, in preferred embodiments, said causing means comprise means for injection of non-equilibrium charge carriers by means of a forward biased p-n junction or other appropriate injection mechanisms, e.g., means that produce impact excitation with hot carriers, or avalanche breakdown.

The Si-based waveguide material typically contains more than 90 atomic % Si, or Si and Ge, and typically is single crystal material that may be an integral part of a single crystal (doped or undoped) Si body. Significantly, the waveguide material also contains one or more light (atomic number $\leq 9$, but excluding oxygen) elements, preferably C, N, or F, but not excluding Be, herein referred-to as a "co-dopant". The presence of the co-dopant can result in substantially higher luminescence, as compared to analogous prior art material. In currently preferred embodiments the waveguide material further contains oxygen in an amount that is effective to still further increase the luminescence.

It will be understood that herein the luminescence is always compared between material according to the invention and (comparison) material that is identical to the inventive material except for the absence of the relevant constituent, e.g., the co-dopant or oxygen, as the case may be. We consider an improvement of 10% to be substantial, but typically "substantial" improvements in photoluminescence herein are more than 50% or even more than 100% improvements.

In currently preferred embodiments of the invention the excitation of the luminescencing species (e.g., $Er^{+3}$) involves charge injection. The resulting luminescence thus is electroluminescence, a known phenomenon. Means for electrical "pumping" of waveguide means are known and will typically comprise doping of the waveguide means such that a p-n junction is formed, and will further comprise means for electrically contacting, respectively, the p-portion and the n-portion of the waveguide, such that current can be caused to flow between the contacting means.

DETAILED DESCRIPTION OF SOME PREFERRED EMBODIMENTS

A significant aspect of the instant invention is enhancement of RE (typically Er, Pr and/or Nd) luminescence in Si-based waveguides by means of appropriate co-dopants. These rare earths are of special interest since their luminescence spectrum includes wavelengths of particular interest for optical fiber communications, respectively about 1.54 $\mu$m and 1.3 $\mu$m. As is well known, the different RE elements have very similar properties. Thus it can be expected that, in general, a luminescence effect observed with one RE element, e.g., with Er, will also be observed with other RE elements.

Co-doping can be accomplished by ion implantation into an appropriately shaped Si or Si-containing body. However, other means of co-doping are contemplated, including growth (e.g., by MBE) of appropriately doped Si or SiGe alloy.

Into conventional Si wafers we implanted Er at energies up to 5.25 MeV. The highest energy, according to standard calculations, locates the maximum Er concentration at about 1.5 $\mu$m depth from the wafer surface. We furthermore co-implanted various other elements, the ion energies typically chosen to result in maximum ion concentration at about 1.5 $\mu$m depth. After completion of the implantation the wafers were annealed in a vacuum furnace. Some of the Si wafers were Czochralski-grown (CZ) material which is known to contain a significant concentration (up to about $10^{18}$ cm$^{-3}$) of oxygen. The remainder of the Si wafers were float zone (FZ) material, known to contain significantly less oxygen.

Figure 1:
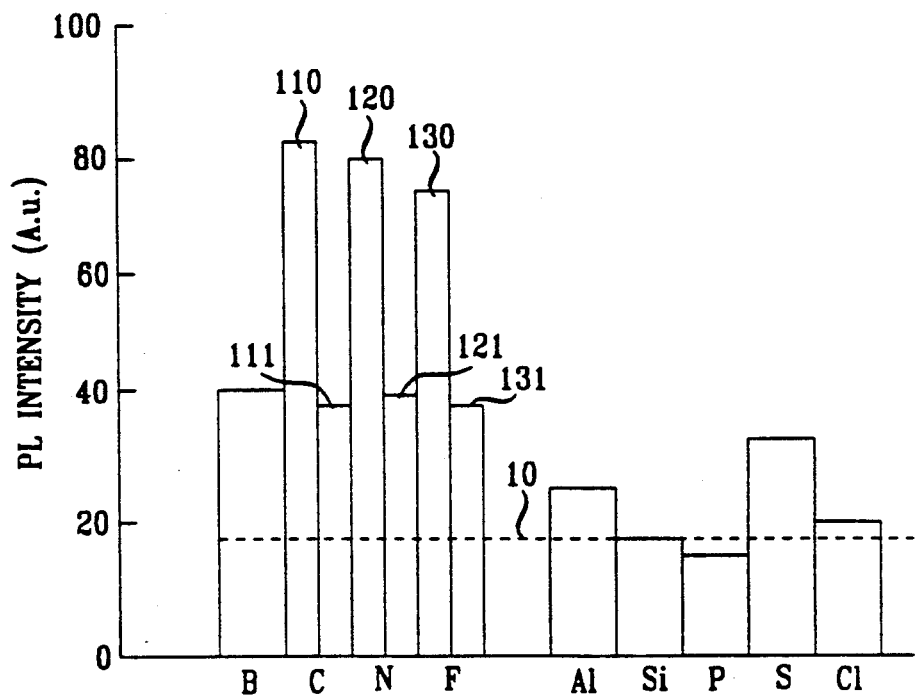
FIG. 1 shows experimental data on luminescence from Er-containing Si, co-doped with a variety of elements.

FIG. 1 shows PL data (1.537 $\mu$m) for Si samples implanted with Er together with the indicated elements. The peak concentrations of all implanted elements were $10^{18}$ cm$^{-3}$, and all samples were annealed at 900° C. for 30 minutes. Dash line 10 corresponds to PL from Er-doped (CZ) Si, without co-doping. FIG. 1 reveals the surprising and unexpected result that there exist some light elements (including C, N and F, but possibly also Be) whose presence in Er-doped Si can result in greatly increased luminescence. Although a substantial increase is observed in FZ material (see bars 111, 121 and 131), the increase is substantially greater in CZ (i.e., oxygen-containing) material (see bars 110, 120, 130). Preferred devices according to the invention therefore will contain, in addition to the effective amounts of RE and light elements other than oxygen, an amount of oxygen effective to further increase the PL emission. Elements such as B and S also result in PL intensity higher than that from Er-doped CZ-Si, but the intensity is not significantly higher in oxygen-containing material. For this reason B and S are not among the currently preferred co-dopants.

The data of FIG. 1 were obtained by exciting PL with 150 mW (corresponding to 100 mW/cm$^2$ at the sample) of 488 nm radiation from an argon ion laser, and measuring the luminescence with a 0.75 m commercial monochromator and a cooled Ge detector. The data were obtained at 4.2K. However, the relative intensities are expected to be substantially similar at room temperature.

As is well known, an optical waveguide comprises a "core" region having a first effective refractive index, the core region being surrounded by a "cladding" region having a second effective refractive index that is lower than the first index. Planar optical waveguides are known, including planar Er-implanted glass waveguides. See, for instance, U.S. patent application Ser. No. 07/579,118, incorporated herein by reference.

Figure 2:
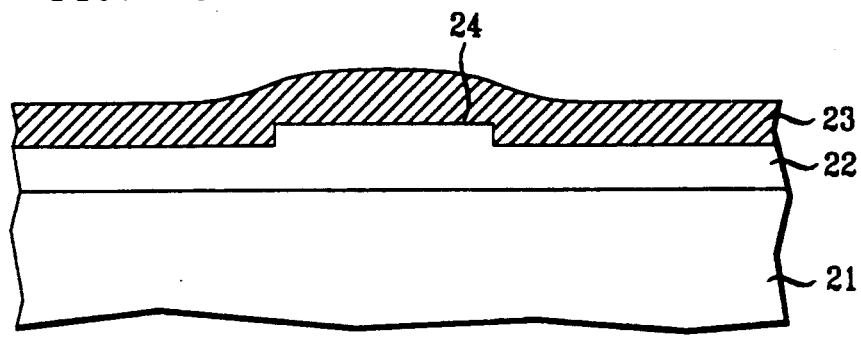
FIG. 2 schematically depicts an exemplary planar waveguide.

Exemplary of waveguide means suitable for use in apparatus according to the invention is a ridge waveguide as is schematically depicted in FIG. 2, wherein numeral 21 refers to the Si substrate, 22 to a core layer (e.g., comprising at least 90 atomic % SiGe alloy having effective refractive index greater than that of Si, and 23 to a cladding layer, e.g., SiO$_2$ or Si. Numeral 24 refers to the ridge whose presence provides lateral guiding of the radiation. It will be appreciated that in devices according to the invention at least a portion of layer 22 (typically the portion underlying ridge 24) is doped with the appropriate rare earth ions and the co-dopant or co-dopants. Such an optical waveguide can be produced by known procedures.

A variety of materials systems have been used for planar optical waveguides. Among these is GaAs and related III-V compounds such as AlGaAs. Whereas III-V semiconductors can be used to manufacture optical gain devices, their thermal conductivity typically is relatively low, limiting the pumping energy (radiation or electrical current) that can be dissipated. On the other hand, Si has relatively high thermal conductivity, making it possible to construct relatively long (e.g., of order 1 cm) devices according to the invention. This is expected to, inter alia, facilitate design and manufacture of devices capable of providing significant gain for signal radiation of the wavelength or wavelengths of interest herein.

Figure 3:
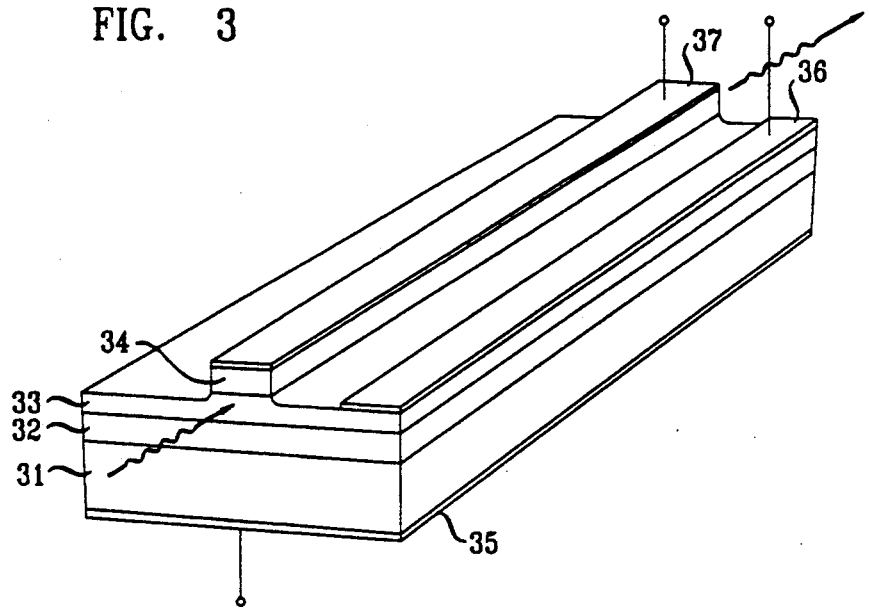
FIG. 3 schematically shows an exemplary injection-pumped device according to the invention.

FIG. 3 schematically shows an electrically pumped device according to the invention. A structurally similar device, suitable for intensity modulation of 1.55 $\mu$m radiation, has been disclosed by R. D. Laveau et al., *Electronics Letters*, Vol. 26 (20), pp. 1653–1655, incorporated herein by reference. In FIG. 3, numeral 31 refers to the single crystal Si substrate (exemplarily doped n+); 32 to the epitaxial Si lower cladding layer (exemplarily doped n); 33 to the epitaxial SiGe alloy core layer (exemplarily p-doped Ge$_{0.2}$Si$_{0.8}$); and 34 to the epitaxial Si top cladding layer (exemplarily doped n). Layers 35, 36 and 37 are metal contact layers that facilitate electrical pumping of the device, with consequent amplification of the radiation coupled into the device. It will be appreciated that core layer 33 comprises RE and a co-dopant according to the invention, and optionally comprises oxygen. It will also be appreciated that electrically pumped embodiments of the invention do not necessarily involve three-terminal devices as shown in FIG. 3, and that a two-terminal p-n structure also has utility. Such a device can be produced by a generally conventional process that is modified to include implantation of the co-dopant or co-dopants.

Figure 4:
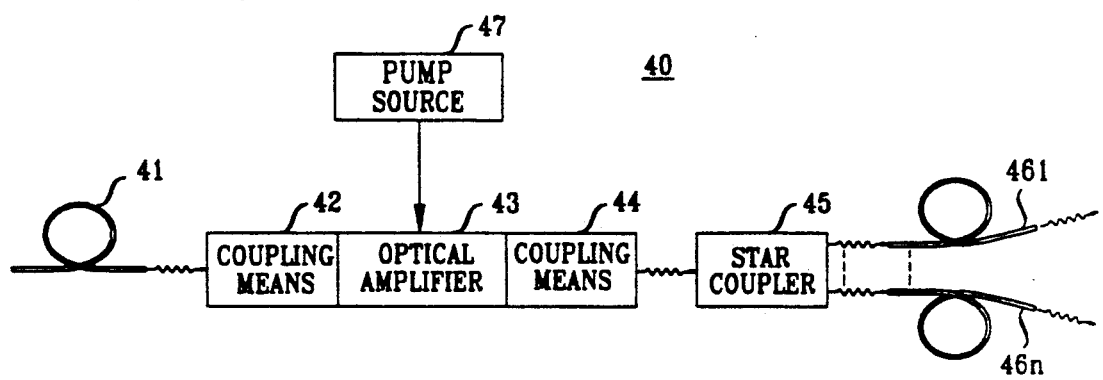
FIG. 4 schematically shows a relevant portion of a communication system according to the invention.

FIG. 4 depicts schematically a portion 40 of an exemplary optical fiber transmission system according to the invention, wherein radiation is transmitted from some generation means (not shown) through optical fiber 41 to amplification means that comprise coupling means 42 (comprising, e.g., focusing means such as a spherical lens) that serve to couple the radiation into the appropriately doped core of inventive planar optical amplifier 43. In 43 the radiation is amplified by stimulated emission, the pump energy derived from pump source 47 (typically an electrical power supply). Optional coupling means 44 serve to couple the amplified radiation into utilization means, exemplarily star coupler 45 serving to divide the radiation into n outputs that are coupled into n optical fibers 461–46n. The signals are transmitted through said fibers to some appropriate utilization means, e.g., an optical detector on a subscriber premise.

Those skilled in the art will appreciate that systems according to the invention can take many forms, and the examples described herein are intended to be illustrative only. For instance, amplification means according to the invention may be utilized in optical computing means. Furthermore, devices according to the invention can serve as radiation sources, namely, as lasers or LEDs.

We claim:

1. An article or system comprising a device that comprises optical waveguide means adapted for guiding signal radiation of wavelength $\lambda_s$, said waveguide means comprising material that contains a rare earth (RE) element selected from the group consisting of erbium (Er), praseodymium (Pr) and neodymium (Nd), the device further comprising means for causing at least some of the RE in the waveguide means to undergo an electronic transition to an excited electronic state that is associated with luminescence;

characterized in that
a) the waveguide means are planar waveguide means comprising a core region comprising semiconductor material selected from the group consisting of Si and SiGe alloy; and
b) the core region further comprises at least one member of the group of elements consisting of C, N, and F, said member to be referred-to as a the "co-dopant", such that the luminescence associated with the waveguide means is substantially higher than the luminescence associated with otherwise identical comparison waveguide means that do not contain the co-dopant.

2. The article or system of claim 1, wherein the core region further comprises oxygen in an amount effective to result in increased luminescence, as compared to otherwise identical comparison waveguide means that substantially do not contain oxygen.

3. The article or system of claim 1, wherein said at least one of the co-dopants is present in an amount sufficient to result in luminescence intensity that is at least double the luminescence intensity associated with said comparison waveguide means.

4. The article or system of claim 1, wherein the optical waveguide means are an integral part of a body that comprises single crystal Si.

5. The article or system of claim 4, wherein said means for causing the RE to undergo the transition comprise means for coupling into the core region electromagnetic radiation of wavelength $\lambda_p < \lambda_s$.

6. The article or system of claim 4, wherein said means for causing the RE to undergo the transition comprise a n-doped and a p-doped portion of the waveguide means, arranged such as to form a p-n junction, and further comprises means for electrically contacting said n-doped portion and said p-doped portion, such that an electrical current can be caused to flow across the p-n junction.

7. The article or system of claim 1, wherein the device comprises reflective means adapted for forming an optical cavity for the signal radiation, the device being a laser.

8. The article or system of claim 1, further comprising means for coupling the signal radiation into the core region of the waveguide means, and means for providing signal radiation from the waveguide means to radiation utilization means, wherein the device is an optical amplifier.

9. The article or system of claim 2, wherein RE is Er, and wherein $\lambda_s$ is approximately equal to 1.55 μm.

10. The article or system of claim 6, wherein the article comprises a p-n homojunction structure in a light emitting diode configuration.

* * * * *